United States Patent
Shimamoto (10) Patent No.: US 12,544,808 B2
(45) Date of Patent: Feb. 10, 2026

(54) REDUCTION TREATMENT METHOD

(71) Applicant: Ushio Denki Kabushiki Kaisha, Tokyo (JP)

(72) Inventor: Akihiro Shimamoto, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 10 days.

(21) Appl. No.: 17/999,502

(22) PCT Filed: Apr. 7, 2021

(86) PCT No.: PCT/JP2021/014727
§ 371 (c)(1),
(2) Date: Nov. 21, 2022

(87) PCT Pub. No.: WO2021/241020
PCT Pub. Date: Dec. 2, 2021

(65) Prior Publication Data
US 2023/0211385 A1      Jul. 6, 2023

(30) Foreign Application Priority Data
May 29, 2020   (JP) .................................. 2020-094569

(51) Int. Cl.
*B08B 7/00*      (2006.01)
*H01L 21/311*    (2006.01)

(52) U.S. Cl.
CPC ....... *B08B 7/0035* (2013.01); *H01L 21/31116* (2013.01)

(58) Field of Classification Search
CPC ... B08B 7/0035; B08B 7/00; H01L 21/31116; H01L 21/31122; H01L 21/02068; C23F 4/00; C23G 5/00
See application file for complete search history.

(56) References Cited

U.S. PATENT DOCUMENTS 5,234,540 A * 8/1993 Grant ................ H01L 21/31116
                                                257/E21.252
5,503,708 A * 4/1996 Koizumi .................. G03F 7/42
                                                257/E21.256
(Continued)

FOREIGN PATENT DOCUMENTS

EP       0568363 A2 * 11/1993    ........ H01L 21/31116
JP       05251415 A  *  9/1993
(Continued)

OTHER PUBLICATIONS

International Search Report issued in PCT/JP2021/014727; mailed Jun. 29, 2021.
(Continued)

*Primary Examiner* — Joshua L Allen
*Assistant Examiner* — Christopher Remavege
(74) *Attorney, Agent, or Firm* — Studebaker Brackett PLLC (57) ABSTRACT

Provided is a reduction treatment method in which hydrogen radicals are efficiently generated in an amount required for reduction treatment and the surface of an object to be treated is reduced by a relatively simple treatment process. A reduction treatment method including: irradiating a hydrogen radical source-containing material with ultraviolet light having a wavelength of 255 nm or less to generate hydrogen radicals; and bringing the generated hydrogen radicals into contact with a surface of an object to be treated to reduce the surface.

8 Claims, 6 Drawing Sheets

(56) References Cited

U.S. PATENT DOCUMENTS

| | | | |
|---|---|---|---|
| 5,967,156 A * | 10/1999 | Rose | H01L 21/67051 |
| | | | 257/E21.224 |
| 2004/0154743 A1* | 8/2004 | Savas | G03F 7/427 |
| | | | 257/E21.256 |
| 2009/0001046 A1 | 1/2009 | Kubota et al. | |
| 2011/0204249 A1* | 8/2011 | Nagai | H05G 2/005 |
| | | | 250/504 R |
| 2012/0015517 A1* | 1/2012 | Oshida | H01L 21/76865 |
| | | | 438/667 |
| 2013/0161540 A1* | 6/2013 | Nagai | H05G 2/006 |
| | | | 250/504 R |
| 2013/0233828 A1 | 9/2013 | Matsumori et al. | |
| 2014/0256128 A1* | 9/2014 | Spurlin | H01L 21/02068 |
| | | | 438/643 |
| 2014/0374619 A1* | 12/2014 | Klebanoff | G03F 7/70925 |
| | | | 250/431 |
| 2016/0133563 A1* | 5/2016 | Ai | H01L 21/76826 |
| | | | 438/628 |
| 2019/0214262 A1* | 7/2019 | Yang | H01J 37/32422 |
| 2020/0161094 A1* | 5/2020 | Zhang | H01J 37/32467 |
| 2020/0306802 A1* | 10/2020 | Aiba | B08B 7/0057 |

FOREIGN PATENT DOCUMENTS

| | | |
|---|---|---|
| JP | H05-251415 A | 9/1993 |
| JP | 2006-307255 A | 11/2006 |
| JP | 2009-010043 A | 1/2009 |
| JP | 2012-023245 A | 2/2012 |
| JP | 2013-135033 A | 7/2013 |
| WO | 2012/063474 A1 | 5/2012 |
| WO | 2019/124321 A1 | 6/2019 |

OTHER PUBLICATIONS

Notification of Transmittal of Translation of the International Preliminary Report on Patentability and Translation of Written Opinion of the International Searching Authority; PCT/JP2021/014727; mailed on Dec. 8, 2022.

An Office Action; "Notice of Reasons for Refusal," mailed by the Japanese Patent Office on Feb. 2, 2024, which corresponds to Japanese Patent Application No. 2020-094569 and is related to U.S. Appl. No. 17/999,502; with English language translation.

* cited by examiner

REDUCTION TREATMENT METHOD

TECHNICAL FIELD

The present invention relates to a reduction treatment method.

BACKGROUND ART

The reduction reactions of surface materials of solid materials are used in various fields. For example, on the surface of copper widely used as an electrical conducting material for electrodes, wires, and the like, an oxide film causing poor electrical conduction is formed by organic matter cleaning with oxygen plasma or ultraviolet light or by lapse of time in an atmosphere containing oxygen or water. In order to remove such an oxide film, a reduction reaction is used. Further, in order to allow an oxide film having a desired purpose, such as a gate insulator film that is an oxide film provided on the surface of a semiconductor such as silicon or gallium nitride, to exhibit its function, it is important to control the film thickness, film quality, and shape of the oxide film. Such control is performed using a reduction reaction. Further, in order to hydrophobize the surface of a solid material such as a resin, a reduction reaction is used to remove oxygen atoms from hydrophilic groups such as hydroxy groups or carboxy groups present on the surface.

Meanwhile, examples of a method for reducing the surface of a solid material include a method using carbon monoxide, a method using formic acid, and a method using hydrogen. Among them, as methods using hydrogen, the following documents are known.

Patent Document 1 discloses that a copper oxide film is subjected to reduction treatment by turning a gas obtained by mixing Ar and hydrogen into plasma to activate the hydrogen. Patent Document 2 discloses that rust (oxide) of an object to be treated is removed by reduction by generating microwave surface-wave hydrogen plasma from hydrogen gas in a vacuum environment. Patent Document 3 discloses that a metal compound film on a metal layer in a heated wafer is removed by reduction by turning a hydrogen-containing gas into plasma to generate hydrogen radicals.

PRIOR ART DOCUMENTS

Patent Documents

Patent Document 1: WO2012/063474
Patent Document 2: JP-A-2006-307255
Patent Document 3: JP-A-2009-010043

SUMMARY OF THE INVENTION

Problems to be Solved by the Invention

The use of hydrogen radicals for reduction of the surface of an object to be treated is known, but the methods for generating hydrogen radicals disclosed in Patent Documents 1 to 3 have the following problems.

In the treatment methods disclosed in Patent Documents 1 and 3, a gas containing hydrogen is turned into plasma by high-frequency power, which complicates a treatment process and a device configuration. Further, a mixture of hydrogen and an inert gas such as Ar is usually used as the gas containing hydrogen in terms of safety and the lighting property of plasma. Therefore, there is a limit to improvement in reduction efficiency due to a low component ratio of hydrogen gas.

In the treatment method disclosed in Patent Document 2, a treatment environment is limited to a vacuum environment and microwave is used, which complicates a treatment process and a device configuration for achieving a treatment environment. Further, it is difficult to efficiently generate a large amount of hydrogen radicals.

With awareness of these issues, it is an object of the present invention to provide a reduction treatment method in which hydrogen radicals are efficiently generated in an amount required for reduction treatment and the surface of an object to be treated is reduced by a relatively simple treatment process.

Means for Solving the Problems

As a result of intensive studies, the present inventor has found a method capable of efficiently generating hydrogen radicals in an amount sufficient to reduce the surface of an object to be treated without using plasma generated by high-frequency power or microwaves. Although described later in detail, the method is a method in which hydrogen radicals are generated by irradiating a hydrogen radical source-containing material with ultraviolet light having a wavelength of 255 nm or less.

The present invention is directed to a reduction treatment method including irradiating a hydrogen radical source-containing material with ultraviolet light having a wavelength of 255 nm or less to generate hydrogen radicals and bringing the generated hydrogen radicals into contact with a surface of an object to be treated to reduce the surface.

The method including generating hydrogen radicals by irradiation with ultraviolet light having a wavelength of 255 nm or less can more simplify a treatment process and a device configuration for treatment as compared to a method using plasma generated by high-frequency power or microwaves. Further, the method including generating hydrogen radicals by irradiation with ultraviolet light having a wavelength of 255 nm or less can generate hydrogen radicals in an amount required for reduction treatment.

The terms "reduce" and "reduction treatment" used herein are paired with the terms "oxidize" and "oxidation treatment". In other words, "reduction" is a reaction that removes oxygen from a target material, a reaction that adds hydrogen to a target material, or a reaction that adds electrons to a target material.

The hydrogen radical source-containing material may contain at least one material belonging to the group consisting of hydrogen gas, a hydrocarbon, $H_2O$, an alcohol, a phenol, $NH_3$, an amine, $H_2S$, and a thiol. These materials can generate a large amount of hydrogen radicals.

The hydrogen radical source-containing material may contain ROH (R is a hydrogen atom or an alkyl group).

The hydrogen radical source-containing material may contain ROH (R is an alkyl group having 3 or more and 10 or less carbon atoms). Ultraviolet light with which such a material is irradiated may be light having a wavelength of 205 nm or less.

The reduction treatment method may be one in which the hydrogen radical source-containing material is brought into contact with the surface of the object to be treated, and the hydrogen radical source-containing material in contact with the surface of the object to be treated is irradiated with the ultraviolet light. High treatment efficiency is achieved because a large area can be subjected to reduction treatment at the same time by generating a large amount of hydrogen radicals at a time.

The reduction treatment method may be one in which the hydrogen radical source-containing material is irradiated with the ultraviolet light to generate hydrogen radicals, and the generated hydrogen radicals are sprayed onto the surface of the object to be treated. Hydrogen radicals can selectively be supplied to an area requiring reduction treatment.

The object to be treated may have, on the surface thereof, an oxide film of a metal or a semiconductor or a resin having a hydrophilic group.

The ultraviolet light may be generated by a xenon excimer lamp.

The present invention is also directed to a reduction treatment method including bringing a material containing hydrogen atoms into contact with a surface of an object to be treated and irradiating the material in contact with the surface of the object to be treated with ultraviolet light having a wavelength of 255 nm or less to reduce the surface of the object to be treated.

Effect of the Invention

According to the present invention, it is possible to provide a reduction treatment method in which hydrogen radicals are efficiently generated in a necessary amount and the surface of an object to be treated is reduced by a simple treatment process.

DETAILED DESCRIPTION OF THE INVENTION

[Outline of Reduction Treatment]

First, the outline of reduction treatment will be described. As light used for reduction treatment, ultraviolet light having a wavelength of 255 nm or less is used.

The "ultraviolet light having a wavelength of 255 nm or less" used herein is light having a light-emission band of 255 nm or less. Examples of such light include broad-wavelength light having an emission spectrum in which a peak emission wavelength at which the intensity is maximum is 255 nm or less and light having an emission spectrum in which a plurality of maximum intensities (a plurality of peaks) are observed at emission wavelengths and any one of the peaks is within a wavelength range of 255 nm or less. Further, the "ultraviolet light having a wavelength of 255 nm or less" also includes light having an emission spectrum in which the integrated intensity of light of 255 nm or less is at least 30% of the total integrated intensity. It should be noted that also when the upper limit of the wavelength is other than 255 (nm), definition is made in the same manner.

Although details will be described later, among ultraviolet light having a wavelength of 255 nm or less (hereinafter when simply referred to as "ultraviolet light", it means light having a wavelength of 255 nm or less), a more suitable wavelength depends on a hydrogen radical source. Further, the type of light source to be used can be selected depending on a desired light wavelength. For example, a xenon excimer lamp is used to obtain light having a wavelength of 172 nm.

Although details of the hydrogen radical source used in a reduction treatment method will be described later, in this case, reaction formulas for generating hydrogen radicals (H·) by irradiating representative materials used in the hydrogen radical source, such as hydrogen or a hydrocarbon (RH), water or a monohydric alcohol (ROH), hydrogen sulfide or a thiol (RSH), ammonia, and a primary amine or secondary amine ($R^1R^2NH$) (R, $R^1$, or $R^2$ are each a hydrogen atom or an alkyl group) with ultraviolet light (UV) are shown below.

$$RH + UV \rightarrow R\cdot + H\cdot$$

$$ROH + UV \rightarrow R{-}O\cdot + H\cdot$$

$$RSH + UV \rightarrow R{-}S\cdot + H\cdot$$

$$R^1R^2NH + UV \rightarrow R^1R^2N\cdot + H\cdot$$

Hydrogen radicals (H·) are generated by irradiating the hydrogen radical source with ultraviolet light (UV). This generation reaction proceeds irrespective of pressure, and therefore it is usually not necessary to make a reaction field a reduced-pressure environment, and reduction treatment can be performed in an atmospheric pressure environment. Although details will be described later, the hydrogen radical source may be in any of gas, liquid, and solid states. When the concentration of the hydrogen radical source is increased, the generation efficiency of hydrogen radicals tends to be improved.

When generated hydrogen radicals (H·) are brought into contact with the surface of an object to be treated, the surface of the object to be treated is reduced. As described above, reduction treatment can be used for various purposes such as removal of an oxide film formed on the surface of an electrical conducting material, control of the film thickness, film quality, and shape of a gate oxide film, and hydrophobization of the surface of a solid material.

[Hydrogen Radical Source]

The hydrogen radical source will be described in detail. The hydrogen radical source is a material containing hydrogen atoms before being turned into radicals. Particularly, as the hydrogen radical source, a material containing at least one material belonging to the group consisting of hydrogen gas ($H_2$), a hydrocarbon, $H_2O$, an alcohol, a phenol, $NH_3$, an amine, $H_2S$, and a thiol is suitable. The above materials can generate a large amount of hydrogen radicals. Examples of the hydrocarbon that can be used include alkanes ($C_nH_{2n+2}$) such as methane ($CH_4$), ethane ($C_2H_6$), propane ($C_3H_8$) . . . , alkenes ($C_nH_{2n}$) such as ethylene ($C_2H_4$), propylene ($C_3H_6$) . . . , and alkynes ($C_nH_{2n-2}$) such as acetylene ($C_2H_2$), methylacetylene ($C_3H_4$) . . . . Examples of the alcohol that can be used include not only monohydric alcohols such as methanol ($CH_3OH$), ethanol ($C_2H_5OH$) . . . but also polyhydric alcohols such as ethylene glycol and glycerin. The phenol is a general term for materials in which an OH group is bonded to an aromatic ring. Examples of the amine that may be used include not only primary amines such as methylamine ($CH_3NH_2$), ethylamine ($C_2H_7NH_2$) . . . but also secondary amines (e.g., dimethylamine (($CH_3$)$_2$NH)) and tertiary amines (e.g., trimethylamine). Examples of the thiol that may be used include not only alkanethiols such as methanethiol ($CH_3SH$), ethanethiol ($C_2H_5SH$) . . . but also materials in which an SH group is bonded to an aromatic ring, such as thiophenol ($C_6H_5SH$).

Among the hydrogen radical sources mentioned above, water or a monohydric alcohol (ROH wherein R is hydrogen or an alkyl group) can suitably be used in consideration of various circumstances such as safety, ease of handling, availability, and economic efficiency.

Among water and monohydric alcohols, in the case of water or methanol or ethanol having moisture absorbency, OH radicals that are oxidative chemical species are generated at the same time with hydrogen radicals by irradiation of moisture contained in the hydrogen radical source with UV. OH radicals may interfere with a reduction reaction. For this reason, a monohydric alcohol that is low in moisture absorbency and has 3 or more carbon atoms is particularly suitable for reduction treatment because the amount of OH radicals generated by UV irradiation is small. In consideration of ease of handling, a monohydric alcohol having 10 or less carbon atoms is more preferred.

FIG. 1 to FIG. 5 are diagrams each showing the ultraviolet light absorption spectrum of a major hydrogen radical source. In FIG. 1 to FIG. 5, the horizontal axis represents the wavelength of ultraviolet light [nm] and the vertical axis represents a photon absorption cross section per molecule [$cm^2 \cdot molecule^{-1}$] on a logarithmic scale. Based on each of the diagrams shown in FIG. 1 to FIG. 5, the wavelength of ultraviolet light suitable for reduction treatment for each hydrogen radical source will be described.

Figure 1:
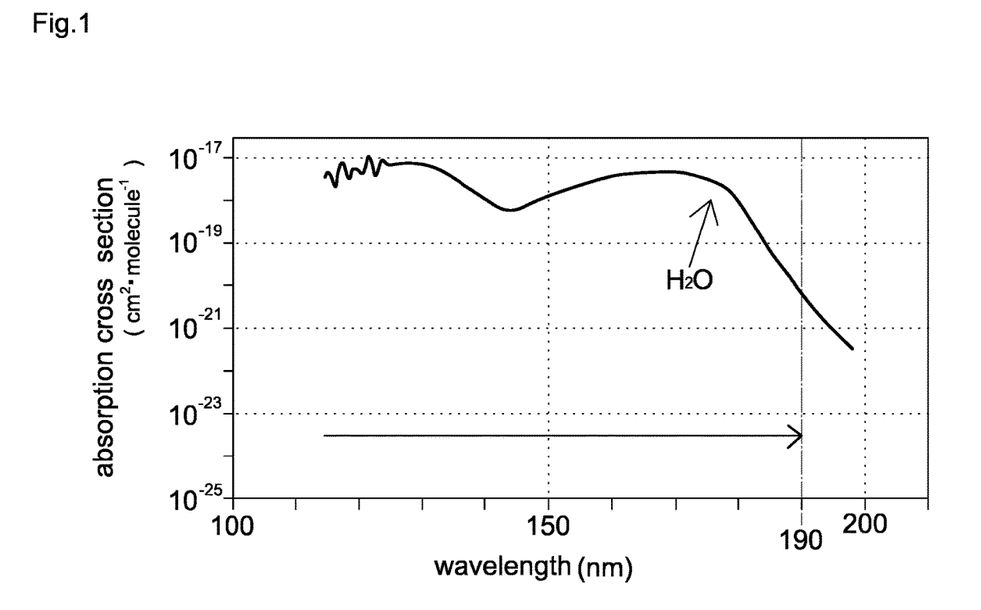
FIG. 1 is a diagram showing the light absorption spectrum of water.
Figure 2:
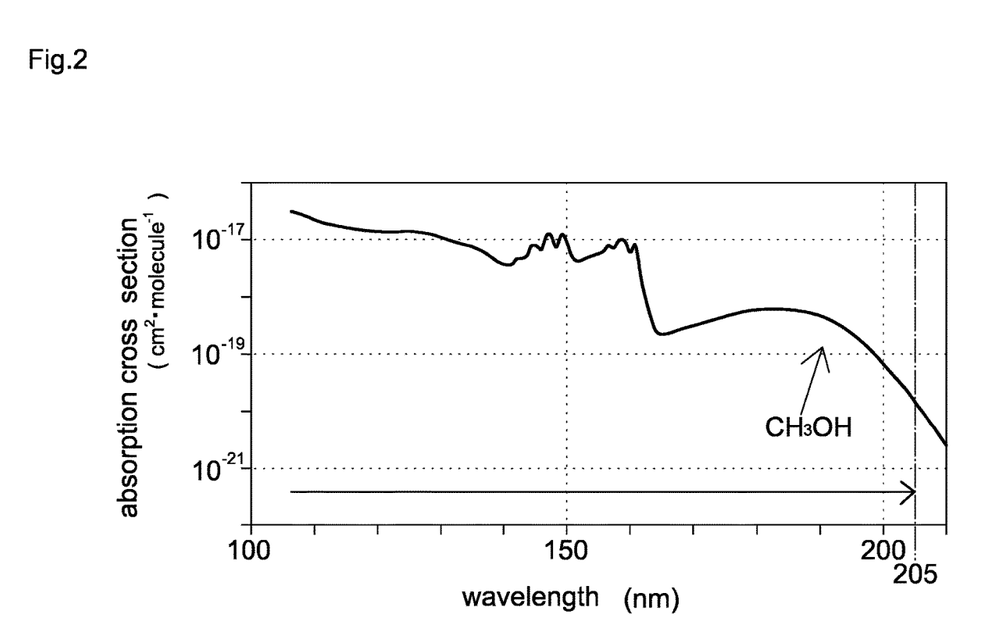
FIG. 2 is a diagram showing the light absorption spectrum of methanol.
Figure 3:
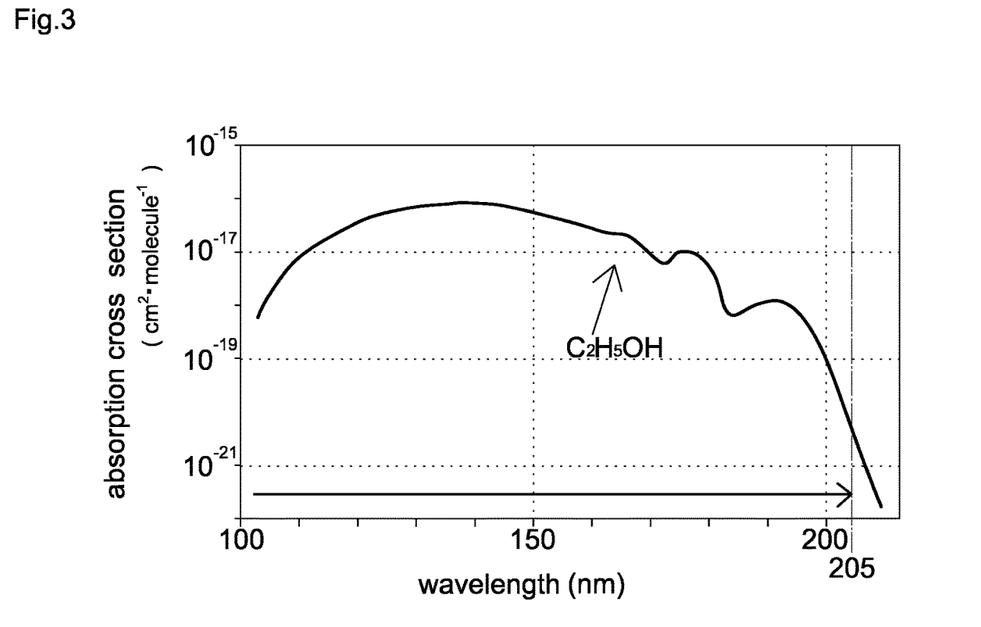
FIG. 3 is a diagram showing the light absorption spectrum of ethanol.
Figure 4:
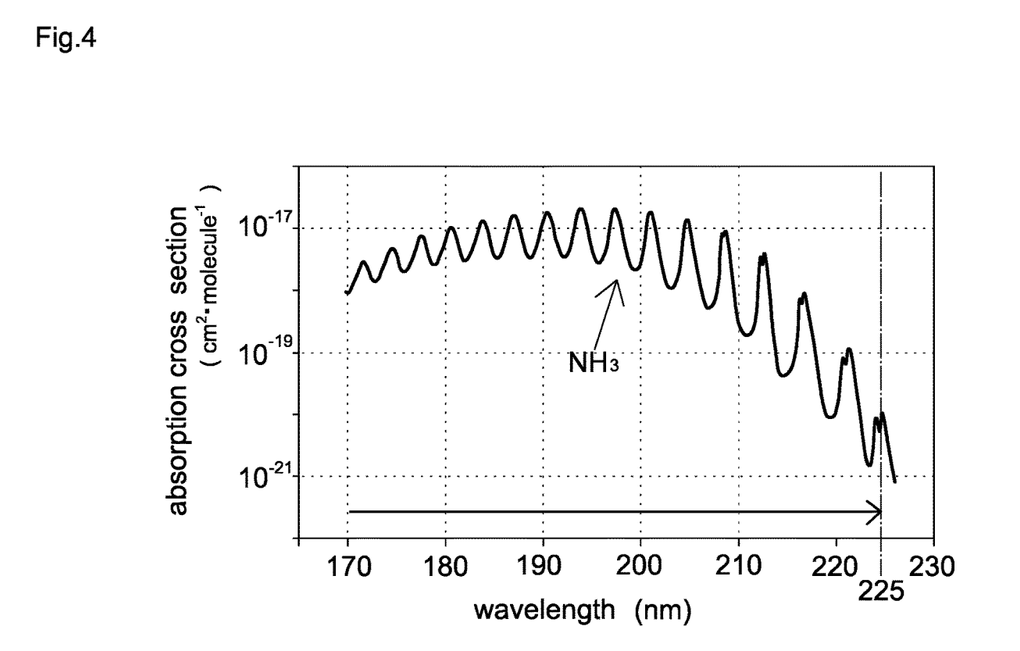
FIG. 4 is a diagram showing the light absorption spectrum of ammonia.
Figure 5:
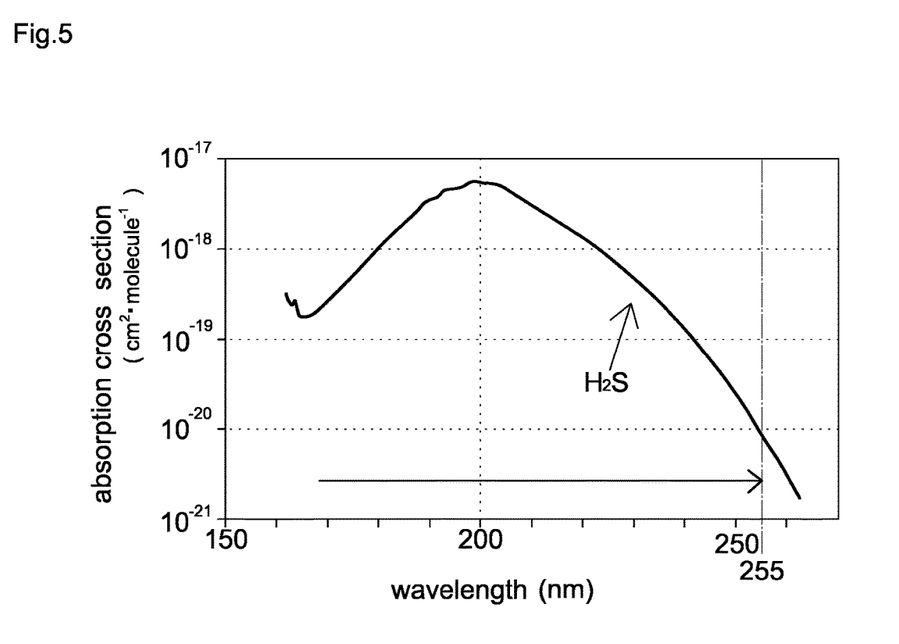
FIG. 5 is a diagram showing the light absorption spectrum of hydrogen sulfide.

FIG. 1 shows the light absorption spectrum of water ($H_2O$). Based on FIG. 1, when water is used as the hydrogen radical source, light of 190 nm or less is effectively used. FIG. 2 shows the absorption spectrum of methanol ($CH_3OH$) and FIG. 3 shows the absorption spectrum of ethanol ($C_2H_5OH$). Based on FIG. 2 and FIG. 3, when any kind of alcohol is used as the hydrogen radical source, light of 205 nm or less is effectively used. FIG. 4 shows the absorption spectrum of ammonia ($NH_3$). Based on FIG. 4, when ammonia is used as the hydrogen radical source, light of 225 nm or less is effectively used. FIG. 5 shows the absorption spectrum of hydrogen sulfide ($H_2S$). Based on FIG. 5, when hydrogen sulfide is used as the hydrogen radical source, light of 255 nm or less is effectively used.

In any of the absorption spectrums of the hydrogen radical source, the wavelength is set so that the photon absorption cross section per molecule is generally about $1 \times 10^{-20}$ ($cm^2 \cdot molecule^{-1}$) or more. This is based on the fact, found by the present inventor as a result of intensive studies, that irrespective of the type of hydrogen radical source, ultraviolet light having a wavelength at which the photon absorption cross section per molecule is about $1 \times 10^{-20}$ ($cm^2 \cdot molecule^{-1}$) or more generally has an absorption ability capable of efficiently generating hydrogen radicals for reduction treatment from the hydrogen radical source. More preferably, the wavelength is set so that the photon absorption cross section per molecule is $1 \times 10^{-19}$ ($cm^2 \cdot molecule^{-1}$) or more. However, a wavelength range suitable for efficiently generating hydrogen radicals changes depending not only on the photon absorption cross section per molecule but also on the concentration of the hydrogen radical source in a hydrogen radical source-containing material or the distance between the light source and the object to be treated.

[Object to be Treated]

An example of the object to be treated includes a metal or a semiconductor having an oxide film on the surface thereof. The oxide film on the surface is removed by a reduction reaction. The object to be treated may be a material such as a resin having a hydrophilic group such as a hydroxy group or a carboxy group on the surface thereof. The surface of the material is hydrophobized by removing oxygen atoms in hydrophilic groups by a reduction reaction. It should be noted that the shape of the object to be treated is not limited to a plate shape and may be a thick shape or a shape having a three-dimensional structure.

First Embodiment

One embodiment of the reduction treatment method will be described with reference to the drawings. It should be noted that the drawings disclosed herein merely show schematic illustrations. Namely, the dimensional ratios on the drawings do not necessarily reflect the actual dimensional ratios, and the dimensional ratios are not necessarily the same between the drawings.

Figure 6A:
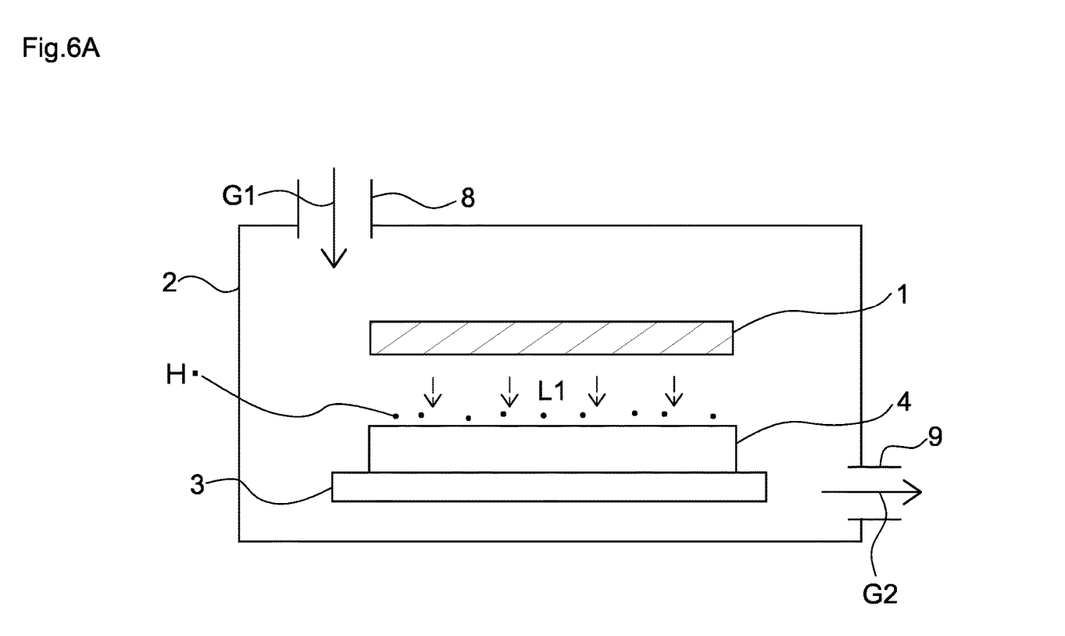
FIG. 6A is a diagram for describing a first embodiment of a reduction treatment method.

With reference to FIG. 6A, a first embodiment of the reduction treatment method will be described. On a stage 3 of a treatment chamber 2 having, in the inside thereof, a light source 1 (hatched area) that emits ultraviolet light, an object 4 to be treated having an oxide on the surface thereof is placed. Then, a hydrogen radical source-containing gas G1 (which is obtained by, for example, adding an inert gas such as nitrogen gas or a noble gas to a gas as a hydrogen radical source) is supplied through an inlet pipe 8 connected to the treatment chamber 2 and an atmosphere gas G2 in the treatment chamber 2 is discharged through an outlet pipe 9 to purge the inside of the treatment chamber 2 with the gas G1.

After the inside of the treatment chamber 2 is purged with the gas G1, ultraviolet light L1 (shown by a dashed line in the drawing) is emitted to excite the hydrogen radical source contained in the gas G1 in the treatment chamber 2 to generate hydrogen radicals (H·). The generated hydrogen radicals (H·) are brought into contact with the oxide on the surface of the object 4 to be treated so that a reduction reaction occurs.

In this embodiment, reduction treatment can be performed on a relatively large area at the same time, and therefore the surface of the object 4 to be treated having a large area can be treated by reduction in a short time. Further, hydrogen radicals are generated near the object 4 to be treated, and therefore the generated hydrogen radicals are used with high efficiency.

The ultraviolet light L1 is absorbed by the gas G1, and therefore the object 4 to be treated is placed to be not too far away from the light source 1 so that hydrogen radicals are generated by the ultraviolet light L1 near the object 4 to be treated. Further, if the object 4 to be treated is too close to the light source 1, the amount of the hydrogen radical source that absorbs light is reduced, and therefore the object 4 to be treated is placed so as not to be too close to the light source 1. That is, the object 4 to be treated is separated from the light source 1 to the extent that hydrogen radicals are generated by the ultraviolet light L1 and the generated hydrogen radicals can be brought into contact with the surface of the object 4 to be treated.

During the reduction treatment, the ultraviolet light L1 may be emitted while the gas G1 is continuously supplied to the treatment chamber 2 in a state where the inlet pipe 8 and the outlet pipe 9 are connected to the treatment chamber 2 or the ultraviolet light L1 may be emitted in a state where the supply of the gas G1 is stopped by disconnecting the inlet pipe 8 and the outlet pipe 9 from the treatment chamber 2 by valves or the like.

Figure 6B:
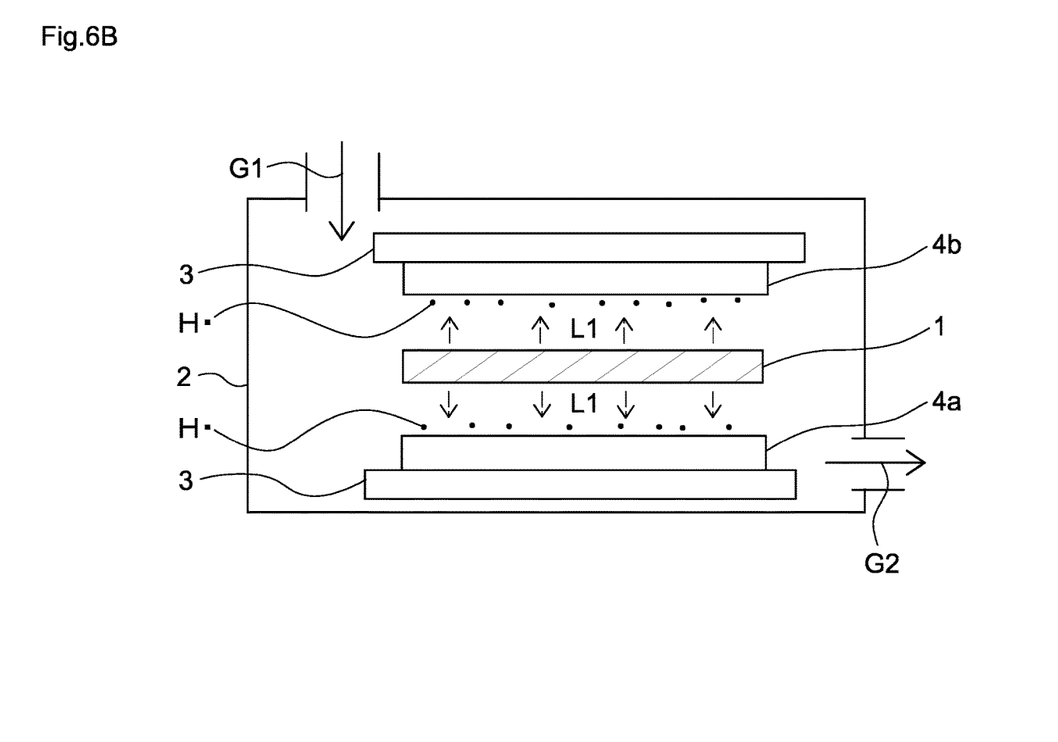
FIG. 6B is a diagram for describing a variation of the first embodiment of the reduction treatment method.

FIG. 6B shows a variation of the reduction treatment method shown in FIG. 6A. Two objects (4a, 4b) to be treated are placed with the light source 1 being interposed therebetween. In FIG. 6B, the two objects (4a, 4b) to be treated are placed to be equidistant from the light source 1 to achieve a uniform reduction treatment speed. It is to be noted that the two objects (4a, 4b) to be treated do not necessarily need to be placed at the same distance from the light source 1.

Second Embodiment

Figure 7:
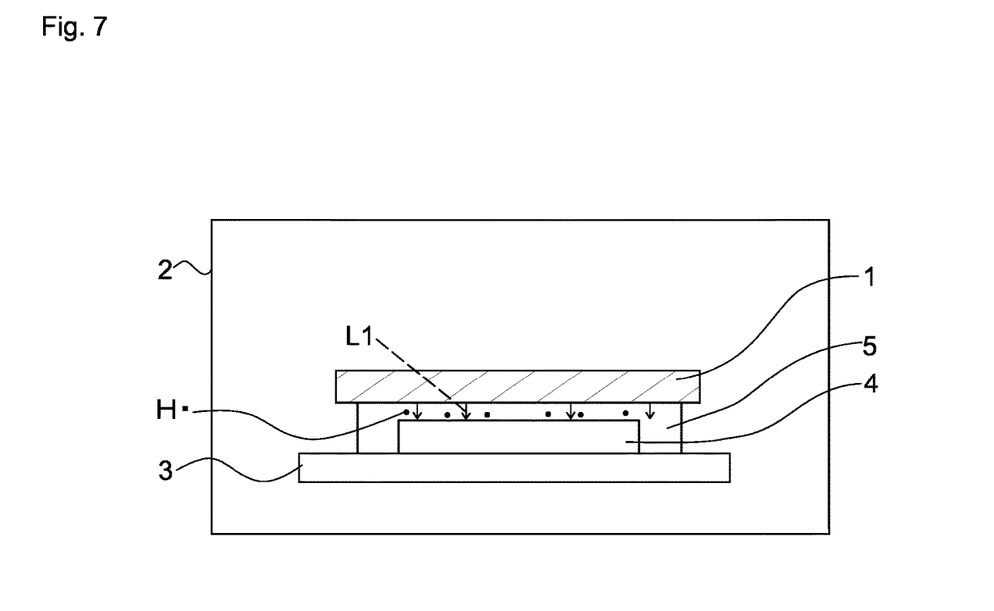
FIG. 7 is a diagram for describing a second embodiment of the reduction treatment method.

With reference to FIG. 7, a second embodiment of the reduction treatment method will be described. The second embodiment can be implemented in the same manner as the first embodiment except for the following points. In FIG. 7, a liquid 5 containing a hydrogen radical source (hereinafter sometimes referred to as a "hydrogen radical source liquid 5") is supplied so as to cover the object 4 to be treated. For example, when the hydrogen radical source-containing material is liquid at ordinary temperature and pressure, the surface of the object 4 to be treated is wetted by pouring the liquid (hydrogen radical source liquid 5) onto the object 4 to be treated or a liquid film is formed from the hydrogen radical source liquid 5 on the object 4 to be treated. The hydrogen radical source liquid 5 is supplied so as to fill a space between the object 4 to be treated and the light source 1 therewith. Before the light source 1 is turned on, the hydrogen radical source liquid 5 may be supplied onto the object 4 to be treated through a supply nozzle not shown in the treatment chamber 2. Alternatively, before placed in the treatment chamber 2, the object 4 to be treated may be wetted (or may have a liquid film formed thereon) by supplying the hydrogen radical source liquid 5 onto the object 4 to be treated in the outside of the treatment chamber 2. Here, the inside of the treatment chamber 2 is preferably filled with an inert gas such as nitrogen gas or a noble gas as an atmosphere gas.

The hydrogen radical source-containing material may be solid. When the hydrogen radical source-containing material is solid at ordinary temperature and pressure, the solid of the hydrogen radical source-containing material may be placed on the object 4 to be treated. However, the solid is required to be thinner than a thickness that allows ultraviolet light to reach the interface between the object 4 to be treated and the solid. When the hydrogen radical source-containing material is preferably solid rather than gas or liquid, the hydrogen radical source-containing material may be solidified by decreasing the temperature of the liquid object 4 to be treated.

Third Embodiment

Figure 8:
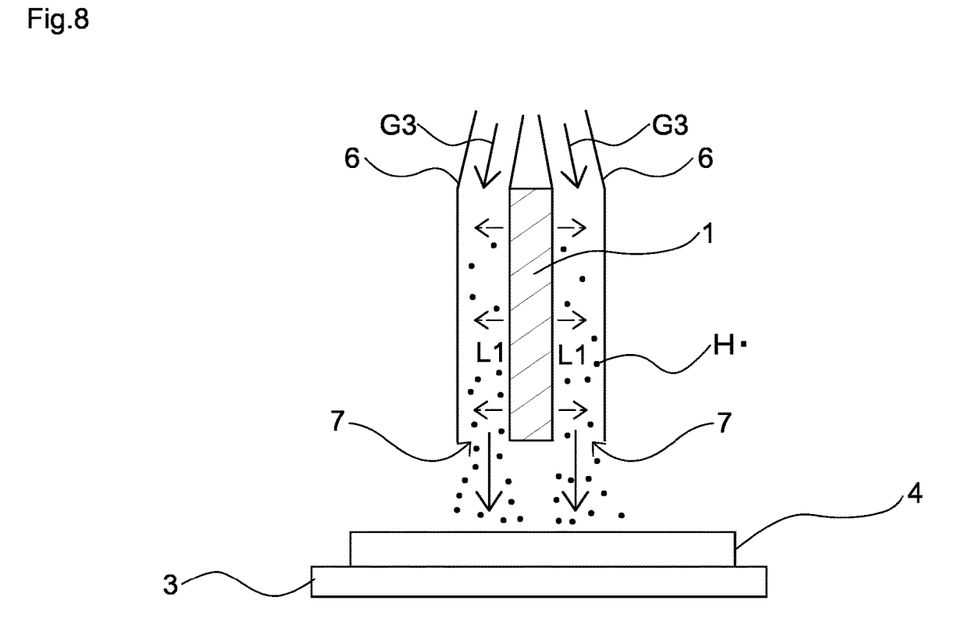
FIG. 8 is a diagram for describing a third embodiment of the reduction treatment method.

A third embodiment of the reduction treatment method will be described with reference to the drawing. The third embodiment can be implemented in the same manner as the first embodiment and the second embodiment except for the following points. In FIG. 8, the ultraviolet light L1 is emitted from the light source 1 disposed outside pipes 6, through which a hydrogen radical source-containing gas G3 flows, toward the hydrogen radical source-containing gas G3 passing through the pipes 6 to excite the hydrogen radical source-containing gas G3 to generate hydrogen radicals (H). Then, the gas containing hydrogen radicals (H) is sprayed onto the surface of the object 4 to be treated from tips 7 of the pipes 6. When hydrogen radicals are brought into contact with an oxide on the surface of the object 4 to be treated, a reduction reaction occurs. In this embodiment, only an area requiring reduction treatment can selectively be treated by relative displacement between the object 4 to be treated and the tips 7 while the distance between the object 4 to be treated and the tips 7 of the pipes 6 is maintained. In this embodiment, it is not necessary to purge a treatment space with the hydrogen radical source-containing gas.

In this embodiment, the light source 1 is interposed between the pipes 6. However, the position of the light source 1 is not limited thereto. For example, the light source 1 may be inserted in the center of a pipe without contact with the inner wall of the pipe, or a plurality of light sources may surround one or more pipes. Further, in this embodiment, the light source 1 is disposed near the tips 7 of the pipes 6. However, the light source 1 may be disposed at the pipes 6 to be far away from the tips 7. This embodiment can be used when the hydrogen radical source-containing material is fluid.

The first embodiment, the second embodiment, and the third embodiment have been described above. However, the present invention is not limited to the above embodiments, and various changes or modifications may be made to the above embodiments without departing from the spirit of the present invention. Further, the first embodiment and the third embodiment may be combined to perform irradiation of the hydrogen radical source with the ultraviolet light both before and after bringing the hydrogen radical source into contact with the surface of the object to be treated. This makes it possible to increase the generation efficiency of hydrogen radicals.

Example 1

Figure 9A:
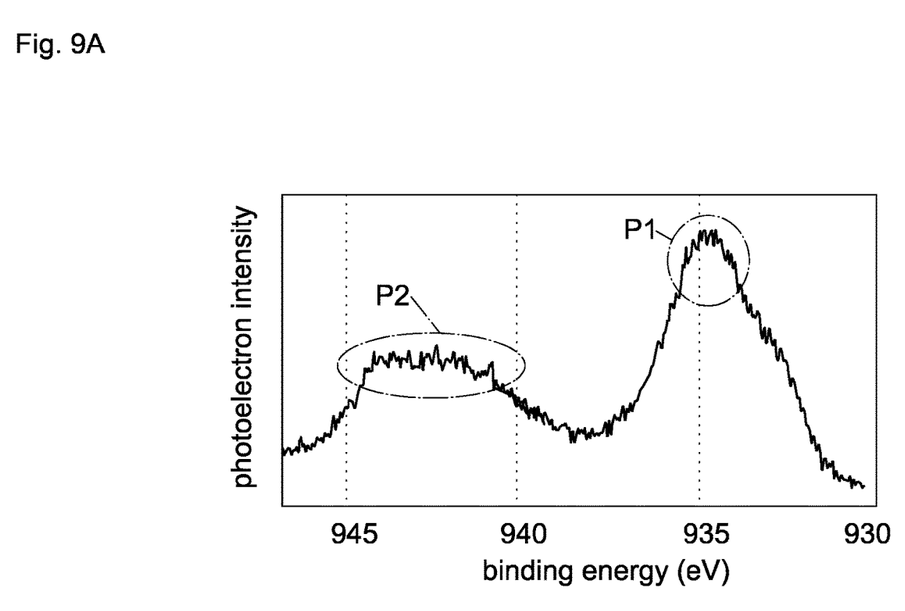
FIG. 9A is a graph showing the result of XPS analysis of a copper plate with an oxide film.

A copper plate having an oxide film on the surface thereof was prepared. Such a copper plate having an oxide film on the surface thereof is referred to as a copper plate with an oxide film. FIG. 9A shows the result of X-ray photoelectron spectroscopy (XPS) analysis of the copper plate with an oxide film. The horizontal axis represents photoelectron binding energy, and the vertical axis represents relative photoelectron intensity. In FIG. 9A, a first peak P1 is observed at around a binding energy of 935 eV and a broad second peak P2 is observed at around a binding energy of 940 to 945 eV. The first peak P1 indicates the presence of CuO having a binding energy of 933.8 eV (or $Cu_2O$ having a binding energy of 932.5 eV), and the second peak P2 represents the satellite peak of CuO. FIG. 9A shows that the oxide film of copper on the surface has been detected.

As a hydrogen radical source, 20 mL of isopropyl alcohol (IPA) was prepared. The copper plate with an oxide film was placed in the treatment chamber 2 described in the first embodiment (FIG. 6A) at an interval of 2 mm from the light source, nitrogen gas was fed into the prepared IPA at 1 L/min, and IPA-containing nitrogen gas obtained by bubbling was fed into the treatment chamber 2.

After the treatment chamber 2 was purged with the IPA-containing nitrogen gas, the light source (a xenon excimer lamp mainly emitting light having a wavelength of 172 nm and having an irradiance at its surface of 30 mW/cm$^2$) was turned on for 15 minutes to perform reduction treatment on the copper plate with an oxide film. In this example, the IPA-containing nitrogen gas was continuously fed into the treatment chamber 2 during the reduction treatment.

Figure 9B:
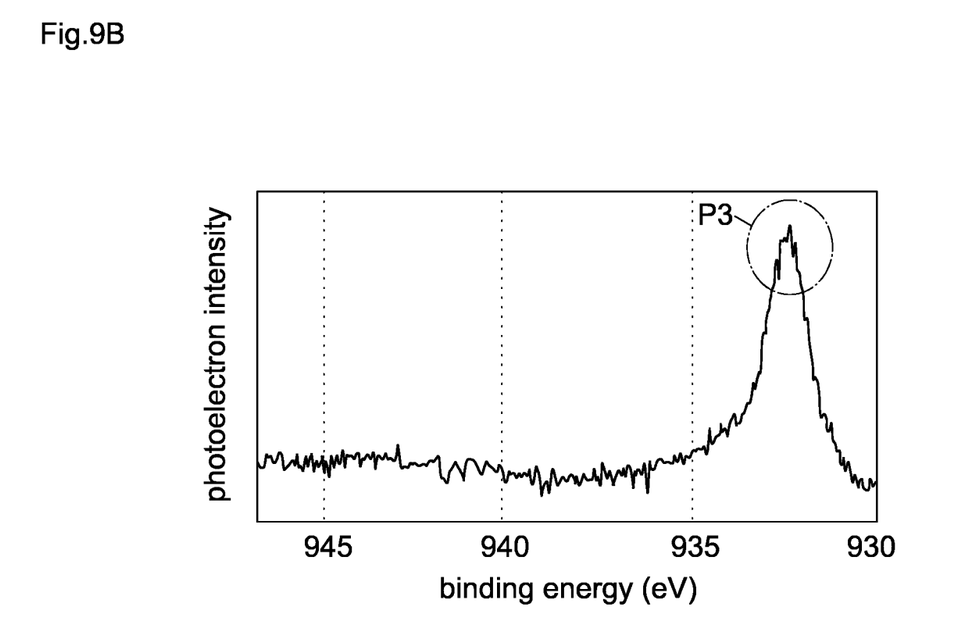
FIG. 9B is a graph showing the result of XPS analysis of the copper plate that has been subjected to reduction treatment.

FIG. 9B shows the result of XPS analysis of the copper plate after the reduction treatment. The peaks (P1, P2) indicating the presence of CuO or Cu$_2$O exhibited in FIG. 9A have disappeared and a third peak P3 indicating the presence of Cu (binding energy: 932.7 eV) can be observed. Therefore, it was confirmed that copper oxide was reduced to copper by the reduction treatment.

Example 2

Nitrogen gas containing ethanol instead of IPA was fed into the same treatment chamber as used in Example 1 to perform reduction treatment on the same copper plate with an oxide film as used in Example 1. Other treatment conditions are the same as those in Example 1.

Figure 10:
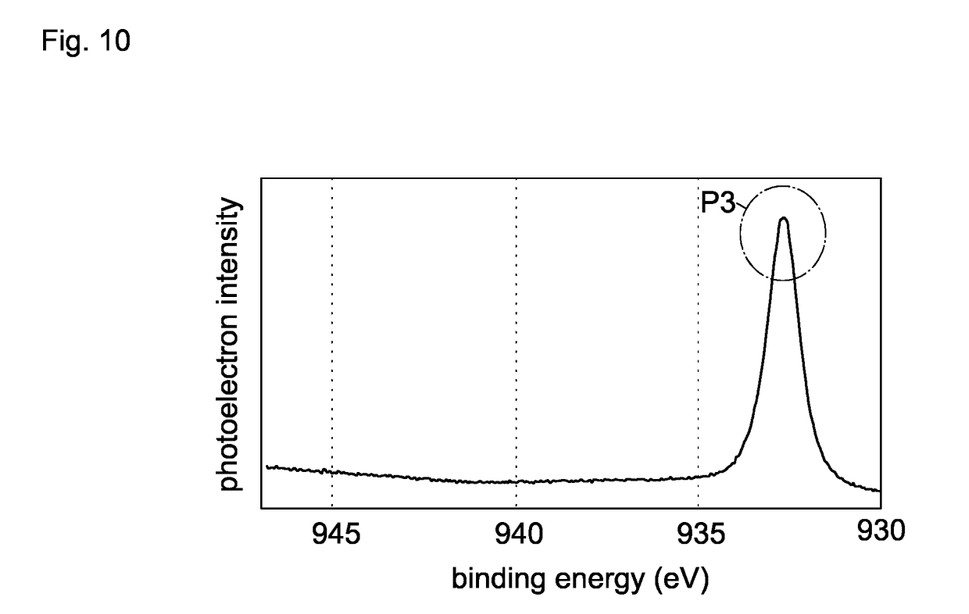
FIG. 10 is a graph showing the result of XPS analysis of the copper plate that has been subjected to reduction treatment.

FIG. 10 shows the result of XPS analysis of the copper plate after the reduction treatment. The peaks (P1, P2) indicating the presence of CuO or Cu$_2$O exhibited in FIG. 9A have disappeared and a third peak P3 indicating the presence of Cu (binding energy: 932.7 eV) can be observed. Therefore, it was confirmed that copper oxide was reduced to copper by hydrogen radicals formed by irradiation of the ethanol-containing gas with light emitted from the light source 1.

DESCRIPTION OF REFERENCE SIGNS

1 Light source
2 Treatment chamber
3 Stage
4 Object to be treated
5 Hydrogen radical source liquid
6 Pipe
7 Tip
8 Inlet pipe
9 Outlet pipe
G1 Hydrogen radical source-containing gas
G2 Atmosphere gas in treatment chamber
G3 Hydrogen radical source-containing gas
L1 Ultraviolet light
P1 First peak
P2 Second peak
P3 Third peak

The invention claimed is:

1. A reduction treatment method comprising:
using a reduction treatment apparatus to
irradiate a hydrogen radical source-containing material with ultraviolet light having a wavelength of 205 nm or less to generate hydrogen radicals, the wavelength of 205 nm or less is set so that the photon absorption cross section per molecule is generally about $1\times10^{-20}$ (cm$^2$·molecule$^{-1}$) or more in the absorption spectrums of the hydrogen radical source-containing material; and
bring the generated hydrogen radicals into contact with a surface of an object to be treated in an atmospheric pressure environment, the hydrogen radicals reduce the surface by at least one of removing oxygen from the object to be treated, adding hydrogen to the object to be treated, and adding electrons to the object to be treated, the object to be treated is a metal or a semiconductor having an oxide film on the surface thereof, or is a resin having a hydrophilic group on the surface thereof,
wherein the hydrogen radical source-containing material is a gas which contains an alcohol,
the reduction treatment apparatus has a light source emitting the ultraviolet light with the wavelength of 205 nm or less and a stage for placing the object to be treated, and
the reduction treatment apparatus does not have a configuration for generating plasma using high-frequency power.

2. The reduction treatment method according to claim 1, wherein the hydrogen radical source-containing material contains ROH (R is an alkyl group having 3 or more and 10 or less carbon atoms).

3. The reduction treatment method according to claim 1, wherein
the hydrogen radical source-containing material is brought into contact with the surface of the object to be treated, and
the hydrogen radical source-containing material in contact with the surface of the object to be treated is irradiated with the ultraviolet light.

4. The reduction treatment method according to claim 1, wherein
the hydrogen radical source-containing material is irradiated with the ultraviolet light to generate hydrogen radicals, and
the generated hydrogen radicals are sprayed onto the surface of the object to be treated.

5. The reduction treatment method according to claim 1, wherein the object to be treated is the metal or the semiconductor having the oxide film on the surface thereof.

6. The reduction treatment method according to claim 1, wherein the object to be treated is the resin having the hydrophilic group on the surface thereof.

7. The reduction treatment method according to claim 1, wherein the light source is a xenon excimer lamp.

8. A reduction treatment method comprising:
using a reduction treatment apparatus to
bring a gas containing an alcohol as a hydrogen radical source-containing material into contact with a surface of an object to be treated, wherein the object to be treated is a metal or a semiconductor having an oxide film on the surface thereof, or is a resin having a hydrophilic group on the surface thereof; and
irradiate the gas in contact with the surface of the object to be treated with ultraviolet light having a wavelength of 205 nm or less to generate hydrogen radicals and to contact the hydrogen radicals to the surface of the object to be treated in an atmospheric pressure environment, the hydrogen radicals reduce the surface by at least one of removing oxygen from the object to be treated, adding hydrogen to the object to be treated, and adding electrons to the object to be treated, the wavelength of 205 nm or less is set so that the photon absorption cross section per molecule is generally about $1\times10^{-20}$ (cm$^2$·molecule$^{-1}$) or more in the absorption spectrums of the hydrogen radical source-containing material,
wherein the reduction treatment apparatus has a light source emitting the ultraviolet light with the wavelength of 205 nm or less and a stage for placing the object to be treated, and the reduction treatment apparatus does not have a configuration for generating plasma using high-frequency power.

\* \* \* \* \*